(12) United States Patent
Genba

(10) Patent No.: US 9,269,572 B2
(45) Date of Patent: Feb. 23, 2016

(54) METHOD FOR MANUFACTURING SILICON CARBIDE SEMICONDUCTOR SUBSTRATE

(71) Applicant: Sumitomo Electric Industries, Ltd., Osaka-shi (JP)

(72) Inventor: Jun Genba, Itami (JP)

(73) Assignee: Sumitomo Electric Industries, Ltd., Osaka-shi (JP)

( * ) Notice: Subject to any disclaimer, the term of this patent is extended or adjusted under 35 U.S.C. 154(b) by 0 days.

(21) Appl. No.: 14/647,774

(22) PCT Filed: Mar. 26, 2014

(86) PCT No.: PCT/JP2014/058524
§ 371 (c)(1),
(2) Date: May 27, 2015

(87) PCT Pub. No.: WO2014/157332
PCT Pub. Date: Oct. 2, 2014

(65) Prior Publication Data
US 2015/0311069 A1    Oct. 29, 2015

(30) Foreign Application Priority Data

Mar. 27, 2013 (JP) ................. 2013-066491

(51) Int. Cl.
*H01L 21/02* (2006.01)
*C30B 29/36* (2006.01)
*C30B 25/16* (2006.01)
(Continued)

(52) U.S. Cl.
CPC ........ *H01L 21/02529* (2013.01); *C30B 25/165* (2013.01); *C30B 25/186* (2013.01); *C30B 25/20* (2013.01); *C30B 29/36* (2013.01); *H01L 21/0262* (2013.01); *H01L 21/02378* (2013.01);
(Continued)

(58) Field of Classification Search
USPC ........................................... 438/931
See application file for complete search history.

(56) References Cited

U.S. PATENT DOCUMENTS

2006/0169668 A1*  8/2006  Samoilov .............. B08B 7/0035
                                                        216/58
2007/0001175 A1    1/2007  Kojima et al.
(Continued)

FOREIGN PATENT DOCUMENTS

JP        2005-064383 A      3/2005
JP        2006-321696 A     11/2006
(Continued)

OTHER PUBLICATIONS

International Search Report in PCT International Application No. PCT/JP2014/058524, dated Jul. 1, 2014.
(Continued)

*Primary Examiner* — Asok K Sarkar
(74) *Attorney, Agent, or Firm* — Venable LLP; Michael A. Sartori

(57) ABSTRACT

A method for manufacturing a silicon carbide semiconductor substrate is provided to offer a silicon carbide semiconductor substrate having a highly flat surface at low cost. The method includes: a step of preparing a silicon carbide substrate as a seed substrate; a step of performing vapor phase etching onto a main surface of the silicon carbide substrate; and a step of epitaxially growing silicon carbide on the main surface. A carbon-atom containing gas is supplied to silicon carbide substrate from a point of time in the step of performing the vapor phase etching.

5 Claims, 3 Drawing Sheets

(51) Int. Cl.
*C30B 25/18* (2006.01)
*C30B 25/20* (2006.01)

(52) U.S. Cl.
CPC .... H01L 21/02576 (2013.01); H01L 21/02658 (2013.01)

(56) References Cited

U.S. PATENT DOCUMENTS

| | | | |
|---|---|---|---|
| 2007/0207596 A1* | 9/2007 | Kim | H01L 21/02381 438/478 |
| 2007/0238302 A1* | 10/2007 | Dip | H01L 21/02046 438/706 |
| 2007/0290211 A1* | 12/2007 | Nakayama | H01L 21/02019 257/77 |
| 2008/0213536 A1 | 9/2008 | Maruyama et al. | |
| 2011/0278596 A1 | 11/2011 | Aigo et al. | |
| 2012/0105094 A1* | 5/2012 | Konstantinov | H01L 29/1608 257/77 |
| 2012/0146056 A1 | 6/2012 | Momose et al. | |
| 2012/0280254 A1 | 11/2012 | Muto et al. | |
| 2013/0217213 A1 | 8/2013 | Aigo et al. | |
| 2014/0070230 A1* | 3/2014 | O'Loughlin | H01L 29/1608 257/77 |
| 2014/0203300 A1* | 7/2014 | Hatayama | H01L 21/3065 257/77 |
| 2014/0264384 A1* | 9/2014 | Loboda | H01L 21/02529 257/77 |
| 2014/0339571 A1 | 11/2014 | Momose et al. | |

FOREIGN PATENT DOCUMENTS

| | | |
|---|---|---|
| JP | 2008-159740 A | 7/2008 |
| JP | 2008-222509 A | 9/2008 |
| JP | 2009-274899 A | 11/2009 |
| JP | 2010-095431 A | 4/2010 |
| JP | 2011-049496 A | 3/2011 |
| JP | 2011-121847 A | 6/2011 |
| WO | WO-2006/022282 A1 | 3/2006 |
| WO | WO-2010/087518 A1 | 8/2010 |
| WO | WO-2012/067112 A1 | 5/2012 |

OTHER PUBLICATIONS

International Preliminary Report on Patentability in PCT International Application No. PCT/JP2014/058524, dated Mar. 6, 2015.

* cited by examiner

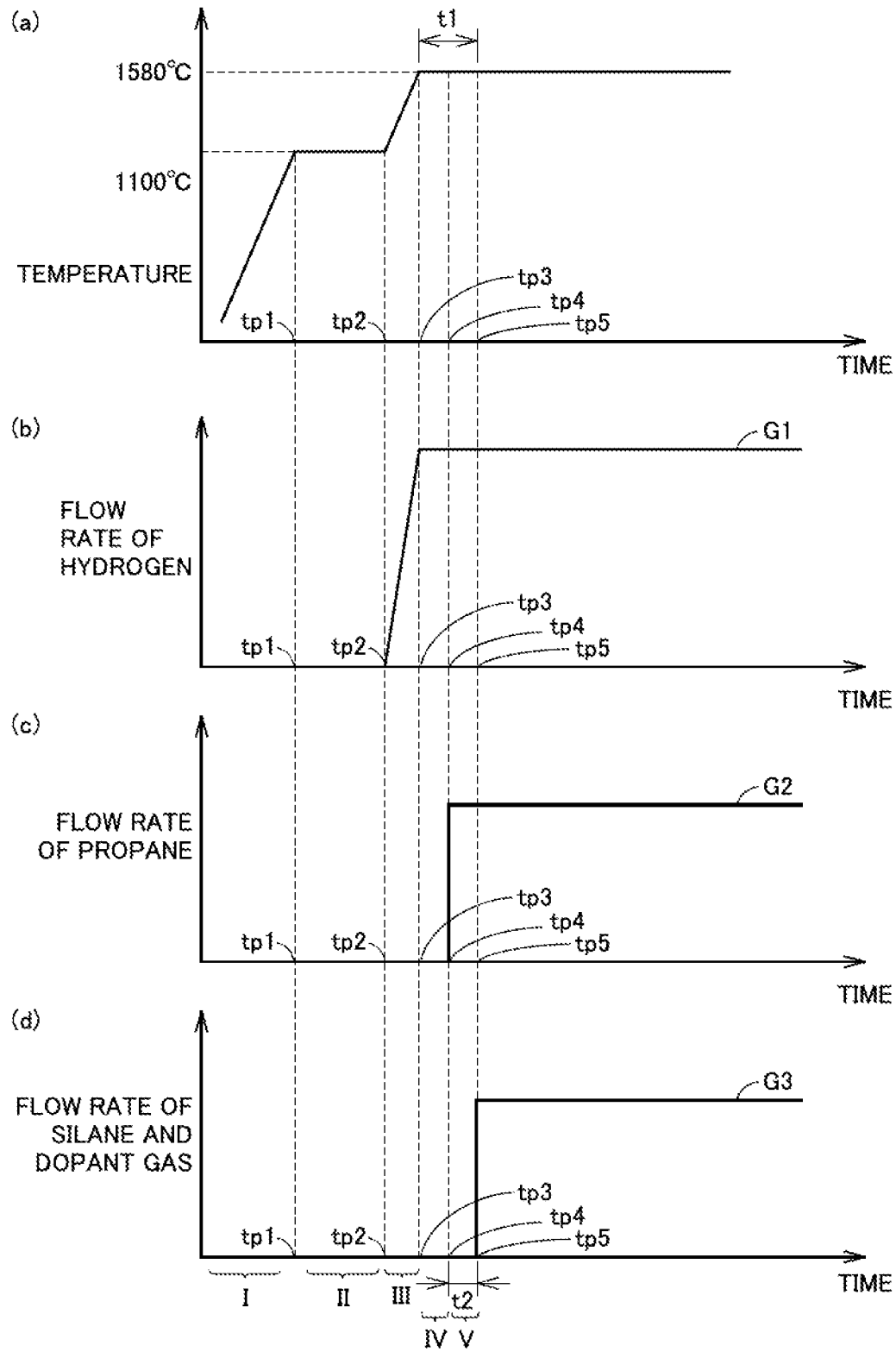

METHOD FOR MANUFACTURING SILICON CARBIDE SEMICONDUCTOR SUBSTRATE

TECHNICAL FIELD

The present invention relates to a method for manufacturing a silicon carbide semiconductor substrate, in particular, a method for manufacturing a silicon carbide semiconductor substrate excellent in surface property.

BACKGROUND ART

In recent years, in order to achieve high breakdown voltage, low loss, and the like in a semiconductor device, silicon carbide (SiC) has begun to be adopted as a material for the semiconductor device. Silicon carbide is a wide band gap semiconductor having a band gap larger than that of silicon, which has been conventionally widely used as a material for semiconductor devices. Hence, by adopting silicon carbide as a material for a semiconductor device, the semiconductor device can have a high breakdown voltage, reduced on-resistance, and the like. Further, the semiconductor device thus adopting silicon carbide as its material has characteristics less deteriorated even under a high temperature environment than those of a semiconductor device adopting silicon as its material, advantageously.

Because silicon carbide has a very low diffusion factor for impurity, it is difficult to dope it with an impurity by means of a thermal diffusion treatment. Examples of a method of forming an active region in a silicon carbide material includes: a method of performing ion implantation into an epitaxial growth layer; and epitaxial growth method involving addition of impurity by way of a dopant gas.

Silicon carbide is epitaxially grown on a silicon carbide single crystal substrate serving as a seed substrate. In doing so, the silicon carbide single crystal substrate is subjected to a surface treatment such as mechanical polishing or chemical polishing, and then the epitaxial film is grown on the surface. Therefore, the surface treatment may cause polishing marks or roughness on the surface of the silicon carbide single crystal substrate.

Moreover, even in the case where the surface of the silicon carbide single crystal substrate is made flat, foreign matters or carbide, silicide, silicon carbide, and the like grown on or adhered to each member in a reaction chamber of a vapor phase epitaxy apparatus may be adhered to or deposited on the surface of the silicon carbide single crystal substrate when epitaxially growing silicon carbide on the surface thereof. In this case, the epitaxial growth is suppressed from being uniformly performed on the surface of the silicon carbide single crystal substrate, whereby the surface of the obtained silicon carbide semiconductor substrate becomes rough and less flat.

Generally, the problem described above is addressed by providing, as a pretreatment for epitaxial growth, vapor phase etching to the surface of the silicon carbide single crystal substrate using hydrogen.

Hydrogen reacts with carbon and silicon constituting the main surface of the silicon carbide single crystal substrate, and produces hydrocarbon and silicane in the vapor phase. Therefore, by exhausting the hydrocarbon and silicane, it is possible to remove foreign matters of carbide or silicide adhered to or deposited on the main surface of the silicon carbide single crystal substrate and to remove defects formed on the main surface of the silicon carbide single crystal substrate.

However, on this occasion, a clean region on the surface of the silicon carbide single crystal substrate is also etched. Moreover, on this occasion, the carbon atoms and the silicon atoms differ from each other in terms of a rate of reaction with the hydrogen atoms, with the result that the main surface of the silicon carbide single crystal substrate may become rough after the vapor phase etching.

Therefore, when epitaxially growing silicon carbide on the main surface of the silicon carbide single crystal substrate having been through the vapor phase etching using hydrogen to remove the foreign matters or defects on the surface as described above, the obtained surface of the silicon carbide semiconductor substrate becomes rough, thus making it difficult to attain a flat surface.

As a method of producing a silicon carbide single crystal substrate having a highly flat surface, Japanese Patent Laying-Open No. 2005-64383 discloses a method of cleaning a surface of a substrate using a mixed gas of hydrogen gas and propane gas at 1400° C. to 1600° C.

CITATION LIST

Patent Document

PTD 1: Japanese Patent Laying-Open No. 2005-64383

SUMMARY OF INVENTION

Technical Problem

However, when removing foreign matters or defects on the surface by performing vapor phase etching onto the surface using the mixed gas of hydrogen and propane while the substrate temperature of the seed substrate made of silicon carbide is set at not less than 1400° C., the removal effect provided by the vapor phase etching may be decreased depending on types of foreign matters or defects.

This is due to the following reason. As described above, hydrogen in the vapor phase etching reacts with carbon atoms and silicon atoms constituting silicon carbide and produces hydrocarbon and silicane in the vapor phase. On this occasion, when propane, which supplies carbon atoms, is supplied to the etching atmosphere, the effect of removing the foreign matters or the like including the carbon atoms are considered to be decreased.

Moreover, an increased amount of usage of propane leads to high manufacturing cost of the silicon carbide semiconductor substrate.

The present invention has been made to solve the foregoing problem. The present invention has a main object to provide a method for manufacturing a silicon carbide semiconductor substrate so as to offer a silicon carbide semiconductor substrate having a highly flat surface at low cost.

Solution to Problem

As a result of diligent study to solve the above-mentioned problem, the present inventors have found that a silicon carbide semiconductor substrate having a highly flat surface is obtained in the following manner: vapor phase etching is performed onto a surface of a seed substrate using only hydrogen, a gas containing carbon atoms is additionally supplied from a point of time in the vapor phase etching, and silicon carbide is then epitaxially grown on such a surface.

A method for manufacturing a silicon carbide semiconductor substrate in the present invention includes steps of: preparing a seed substrate; performing vapor phase etching onto a surface of the seed substrate; and epitaxially growing silicon carbide on the surface, a carbon-atom containing gas being supplied to the seed substrate from a point of time in the step of performing the vapor phase etching. In the step of performing the vapor phase etching, a gas including hydrogen atoms is preferably used.

Accordingly, by the vapor phase etching step, it is possible to securely remove foreign matters or the like adhered to or deposited on the main surface of silicon carbide substrate 1 and it is possible to supply the main surface of silicon carbide substrate 1 with the carbon-atom containing gas from a point of time in the vapor phase etching step.

On this occasion, due to the vapor phase etching using the gas including hydrogen atoms, the carbon atoms constituting the main surface react with the hydrogen atoms at a rate higher than that of the silicon atoms therewith and are removed as hydrocarbon. Accordingly, it is considered that carbon atoms are insufficient in the main surface, with the result that a composition ratio between carbon atoms and silicon atoms is deviated from a value optimal for a seed substrate. Actually, the inventors have confirmed that the main surface of the silicon carbide semiconductor substrate obtained by the epitaxial growth on the main surface in such a state becomes rough and becomes less flat.

To address this, by performing sufficient vapor phase etching and then performing vapor phase etching with the carbon atoms being supplied to the main surface, the vapor phase etching is performed in the atmosphere including the carbon atoms. In this way, the partial pressure of the carbon atoms is increased in the vicinity of the main surface, thereby suppressing the vapor phase etching from providing an effect of removing the carbon atoms constituting the silicon carbide of the main surface. As a result, the composition ratio between carbon atoms and silicon atoms and the surface property in the main surface can be suitable for epitaxial growth. Accordingly, by epitaxially growing silicon carbide on the main surface, a silicon carbide semiconductor substrate having a flat main surface with little surface roughness can be obtained.

Advantageous Effects of Invention

According to the present invention, the silicon carbide semiconductor substrate having a flat surface can be produced at low cost.

BRIEF DESCRIPTION OF DRAWINGS

FIG. 4 is a graph for illustrating the method for manufacturing the silicon carbide semiconductor substrate according to the present embodiment.

DESCRIPTION OF EMBODIMENTS

The following describes a method for manufacturing a silicon carbide semiconductor substrate according to an embodiment of the present invention. First, with reference to FIG. 1, a silicon carbide semiconductor substrate 10 according to the present embodiment will be described. Silicon carbide semiconductor substrate 10 according to the present embodiment includes: a silicon carbide substrate 1 serving as a seed substrate; and an epitaxial layer 2 made of silicon carbide epitaxially grown on silicon carbide substrate 1.

For example, silicon carbide substrate 1 is made of single-crystal silicon carbide. The single-crystal silicon carbide has a hexagonal crystal structure, for example Silicon carbide substrate 1 includes a main surface 1A. Main surface 1A of silicon carbide substrate 1 is made flat and has a root mean square roughness (RMS value) of not more than 0.2 nm, which is measured using an atomic three microscope (AFM).

Epitaxial layer 2 is formed on main surface 1A of silicon carbide substrate 1. Epitaxial layer 2 has n type conductivity, for example. Epitaxial layer 2 has an n type impurity concentration of about not less than $1 \times 10^{18}$ cm$^{-3}$ and not more than $3 \times 10^{18}$ cm$^{-3}$. Epitaxial layer 2 includes main surface 2A.

Figure 1:
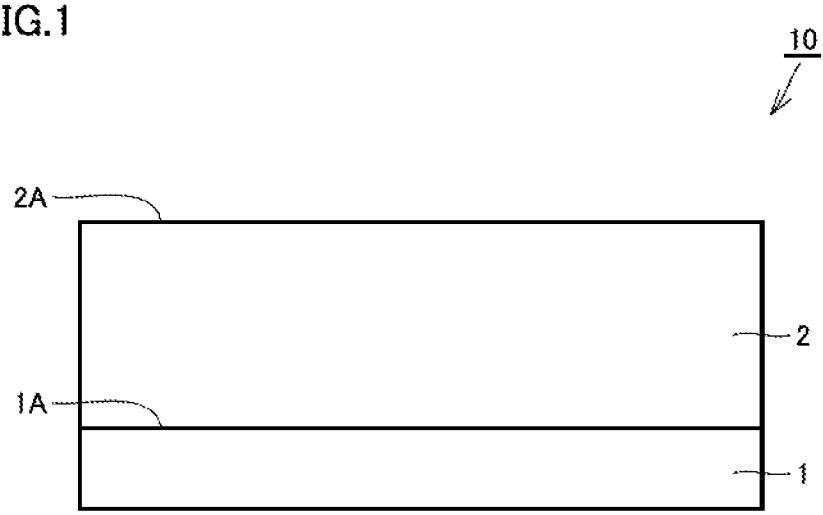
FIG. 1 is a side view of a silicon carbide semiconductor substrate according to the present embodiment.
Figure 2:
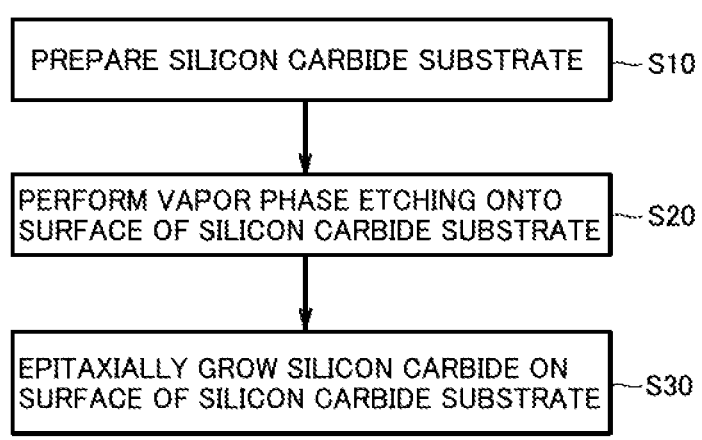
FIG. 2 is a flowchart showing a method for manufacturing the silicon carbide semiconductor substrate according to the present embodiment.

Next, with reference to FIG. 1 and FIG. 2, the following describes a method for manufacturing a silicon carbide semiconductor substrate in the present embodiment, by which silicon carbide semiconductor substrate 10 is manufactured. The method for manufacturing the silicon carbide semiconductor substrate according to the present embodiment includes: a step (S10) of preparing silicon carbide substrate 1 as a seed substrate; a step (S20) of performing vapor phase etching onto main surface 1A of silicon carbide substrate 1; and a step (S30) of epitaxially growing silicon carbide on main surface 1A.

First, in the step (S10), silicon carbide substrate 1 is prepared as a seed substrate. Silicon carbide substrate 1 is made of single-crystal silicon carbide. Silicon carbide substrate 1 has a disk shape having an outer diameter of 4 inches. It should be noted that the outer diameter of silicon carbide substrate 1 may be not less than 4 inches, for example, not less than 5 inches or not less than 6 inches.

Next, in a step (S11), silicon carbide substrate 1 is placed in a vapor phase epitaxy apparatus. In the present embodiment, by way of an example, a CVD (Chemical Vapor Deposition) apparatus 100 is used.

Figure 3:
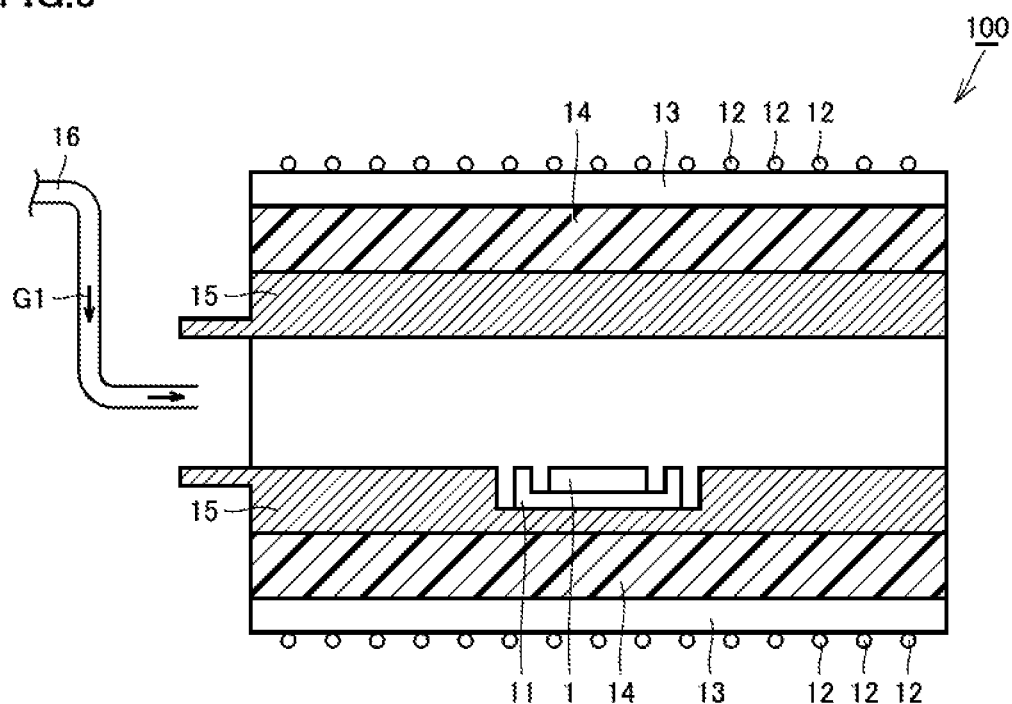
FIG. 3 is a schematic view of a vapor phase epitaxy apparatus used for the method for manufacturing the silicon carbide semiconductor substrate according to the present embodiment.

With reference to FIG. 3, CVD (Chemical Vapor Deposition) apparatus 100 is used as the vapor phase epitaxy apparatus in the present embodiment. In CVD apparatus 100, a substrate holder 11 is surrounded by an induction heating coil 12, a quartz tube 13, a heat insulator 14, and a heating element 15. Specifically, heating element 15 has a hollow structure and has a reaction chamber formed therein. Substrate holder 11 is provided in heating element 15, and is formed such that main surface 1A of silicon carbide substrate 1 (see FIG. 1) is flush with the inner circumferential surface of the reaction chamber when silicon carbide substrate 1 is placed, for example. Substrate holder 11 is placed in a recess formed in the inner circumferential surface of heating element 15, for example. Heat insulator 14 is disposed to surround the outer circumference of heating element 15. Quartz tube 13 is disposed to surround the outer circumferential side of heat insulator 14. Induction heating coil 12 includes a plurality of coil members, and is provided to be wound around the outer circumferential side of quartz tube 13, for example. When high frequency current flows in induction heating coil 12 serving as a high frequency coil, heating element 15 is inductively heated due to electromagnetic induction action. Accordingly, silicon carbide substrate 1 and a source material gas or the like supplied to silicon carbide substrate 1 can be heated to a predetermined temperature.

In this case, the reaction chamber (or heating element 15) of CVD apparatus 100 is constructed of a high-purity carbon member containing a small amount of $N_2$ as an impurity, and may not be coated with TaC or SiC.

Next, with reference to FIG. 4, the following describes steps (S12) to (S30) performed in the CVD apparatus. FIG. 4(a) to FIG. 4(d) show graphs in which the horizontal axes represent time and the vertical axes are defined as follows. The vertical axis of FIG. 4(a) represents a temperature in the reaction chamber, the vertical axis of FIG. 4(b) represents a flow rate of hydrogen introduced into the reaction chamber, the vertical axis of FIG. 4(c) represents a flow rate of propane introduced into the reaction chamber, and the vertical axis of FIG. 4(d) represents a flow rate of silane and dopant gas introduced into the reaction chamber.

In a step (S12), vacuum baking is performed in the reaction chamber having silicon carbide substrate 1 placed therein (period I in FIG. 4). Specifically, with reference to FIG. 4(a), the reaction chamber is evacuated to attain an atmosphere pressure of $5\times10^{-14}$ Pa in the reaction chamber, and then the temperature is increased to 1100° C. using heating element 15 in the reaction chamber (period I in FIG. 4). After the evacuation and temperature increase, this state is maintained (for 10 minutes, for a example) as vacuum baking during a period of time point tp1 to time point tp2 (period II in FIG. 4).

Next, in the step (S20), vapor phase etching is performed onto main surface 1A of silicon carbide substrate 1 prepared in the previous step (S10). The vapor phase etching is performed to remove foreign matters adhered to or deposited on main surface 1A before epitaxially growing silicon carbide on main surface 1A of silicon carbide substrate 1 (before the next step (S30)). Here, examples of the foreign matters adhered to or deposited on main surface 1A of silicon carbide substrate 1 include a reaction product adhered in the vapor phase epitaxy apparatus. In order to remove the foreign matters adhered to or deposited on main surface 1A before epitaxially growing silicon carbide on main surface 1A of silicon carbide substrate 1, this step (S20) is performed, subsequent to the previous step (S12), using the vapor phase epitaxy apparatus to be used in the next step (S30).

Specifically, first, in this step (S20), main surface 1A of silicon carbide substrate 1 is etched using hydrogen ($H_2$) (step (S21) and periods III, IV in FIG. 4). Specifically, with reference to FIG. 4(b), CVD apparatus 100, from time point tp2, hydrogen is introduced into the reaction chamber via a pipe 16 (see FIG. 3). In this case, it is assumed that hydrogen used in this step (S21) has the same component and concentration as those of hydrogen used as a carrier gas in the epitaxial growth. Further, the flow rate of hydrogen gas used in this step (S21) is increased during a period of time point tp2 to time point tp3 such that the flow rate becomes finally equal to the flow rate of hydrogen gas when used as a carrier gas in the next step (830).

Moreover, during the period of time point tp2 to time point tp3 the temperature in the reaction chamber is further increased from 1100° C. to 1580° C., which is a growth temperature in the next step (S30).

Accordingly, hydrogen supplied onto main surface 1A of silicon carbide substrate 1 reacts with carbon and silicon constituting main surface 1A of silicon carbide substrate 1, thereby producing hydrocarbon and silicone in the vapor phase. By exhausting the hydrocarbon and silicone, it is possible to securely remove foreign matters of carbide or silicide adhered to or deposited on main surface 1A of silicon carbide substrate 1 and securely remove defects formed on main surface 1A of silicon carbide substrate 1. It should be noted that this step (S21) is performed until attaining secure removal of the foreign matters of carbide or silicide adhered to or deposited on main surface 1A of silicon carbide substrate 1 as well as secure removal of the defects formed on main surface 1A of silicon carbide substrate 1. On this occasion, a clean region on main surface 1A of silicon carbide substrate 1 is also etched by hydrogen and accordingly becomes rough. This is presumably due to the following reason: a composition ratio is not 1:1 between carbon atoms and silicon atoms in main surface 1A of silicon carbide substrate 1 after the vapor phase etching because carbon atoms of the carbon atoms and silicon atoms constituting the silicon carbide have reacted with hydrogen atoms at a rate higher than the rate of the silicon atoms therewith and have been removed as hydrocarbon as described above.

It should be noted that the vapor phase etching onto main surface 1A of silicon carbide substrate 1 advances also in the stage of increasing the temperature in the reaction chamber during period III (period of time point tp3 to time point tp4) shown in FIG. 4; however, the effect of vapor phase etching is increased after increasing to the epitaxial growth temperature (1580° C.) during period IV (period of time point tp4 to time point tp5) shown in FIG. 4. In the present embodiment, a time t1 for which the vapor phase etching is performed during a period of time (period of time point tp3 to time point tp5) between the end of the temperature increase and the start of the epitaxial growth, i.e., treatment time t1 in the step (S20) of performing the vapor phase etching inclusive of the below-described step (S22) may be equal to or longer than a time necessary to securely remove the foreign matters and defects on main surface 1A, and is more preferably set to be equal to or shorter than a time with which the roughness of main surface 1A of silicon carbide substrate 1 becomes unacceptable. As one example, treatment time t1 in the step (S20) of performing the vapor phase etching in the present embodiment is set at 10 minutes.

Next, from time point tp4, propane ($C_3H_8$) is further introduced into the reaction chamber as a gas containing carbon atoms (step (S22); period V in FIG. 4). Specifically, with reference to FIG. 4(b), in CVD apparatus 100, propane is introduced via pipe 16 into the reaction chamber in addition to hydrogen. In this case, it is assumed that propane used in this step (S22) has the same component and concentration as those of propane used as a source material gas in the epitaxial growth of the next step (S30). Further, the flow rate of propane used in this step (S22) is made equal to the flow rate of propane when used as a source material gas in the next step (S30). Moreover, in this step (S22), hydrogen is introduced into the reaction chamber under the same conditions as those in the previous step (S21).

Moreover, the temperature of the reaction chamber in this step (S22) is maintained at 1580° C., which is a temperature allowing for epitaxial growth of silicon carbide, as with the previous step (S21). In this case, a time t2 (period of time point tp4 to time point tp5) for which this step (S22) is performed is 10 seconds, for example.

Accordingly, the propane introduced into the reaction chamber in this step (S22) is thermally decomposed to produce carbon atoms. The carbon atoms, together with the hydrogen atoms supplied continuously from the previous step (S21), are supplied to main surface 1A of silicon carbide substrate 1 heated at about 1580° C. Part of the supplied carbon atoms react with the hydrogen atoms, become hydrocarbon, and are exhausted while the rest of the supplied carbon atoms are presumably combined with the silicon atoms of main surface 1A of silicon carbide substrate 1. As a result, in this step (S22), an amount of hydrogen supplied to main surface 1A of silicon carbide substrate 1 and contributing to the vapor phase etching is decreased as compared with the previous step (S21), thereby decreasing the effect of etching main surface 1A of silicon carbide substrate 1. Further, in this step (S22), it is considered that because the carbon atoms are supplied to main surface 1A of silicon carbide substrate 1 under the temperature condition allowing for epitaxial growth of silicon carbide, the carbon atoms can be introduced into main surface 1A from which a larger amount of carbon atoms have been removed by the previous step (S21), thereby obtaining main surface 1A more suitable for epitaxial growth.

Next, continuing from the step (S22), from time point tp5, silicon carbide is epitaxially grown on main surface 1A of silicon carbide substrate 1 as the step (S30). Specifically, after performing the previous step (S22) for 10 seconds, from time point tp5, the reaction chamber is further supplied with monosilane ($SiH_4$) and dopant gas while maintaining each condition for hydrogen and propane and the temperature condition in the reaction chamber in the step (S22), the monosilane ($SiH_4$) serving as another source material gas used for the epitaxial growth of silicon carbide, the dopant gas including ammonia ($NH_3$) and/or nitrogen ($N_2$). In this way, on main surface 1A of silicon carbide substrate 1, epitaxial layer 2 made of silicon carbide is grown.

It is considered that by thus performing the step (S22) and the step (S30) continuously, epitaxial layer 2 made of silicon carbide can be grown on main surface 1A with the imbalance being reduced in the composition ratio between carbon atoms and silicon atoms in main surface 1A by introducing the carbon atoms into main surface 1A of silicon carbide substrate 1 in the step (S22). As a result, silicon carbide semiconductor substrate 10 obtained by the method for manufacturing the silicon carbide carrier according to the present embodiment is provided with a less rough, flat main surface 2A.

As described above, in the method for manufacturing the silicon carbide semiconductor substrate according to the present embodiment, by performing the vapor phase etching onto main surface 1A using only hydrogen in the step (S20) of performing the vapor phase etching onto main surface 1A of silicon carbide substrate 1, it is possible to securely remove the foreign matters of carbide or silicide adhered to or deposited on main surface 1A and securely remove the defects formed on main surface 1A of silicon carbide substrate 1. Further, after performing the vapor phase etching step only using hydrogen for periods III, IV of FIG. 4 until they can be securely removed, propane is supplied into the reaction chamber from time point tp4 in addition to hydrogen, thereby introducing carbon atoms into main surface 1A. As a result, main surface 2A can be a flat surface with little roughness because the foreign matters or defects on main surface 1A have been securely removed before the epitaxial growth in silicon carbide semiconductor substrate 10 obtained according to the present embodiment by growing epitaxially silicon carbide on main surface 1A, as compared with a silicon carbide semiconductor substrate obtained by the conventional method for manufacturing the silicon carbide semiconductor substrate in which epitaxial growth is performed after vapor phase etching employing a mixed gas of hydrogen and propane. Further, with the method for manufacturing the silicon carbide semiconductor substrate according to the present embodiment, the carbon atoms can be introduced into main surface 1A before the epitaxial growth and therefore main surface 2A after the growth can be a flat surface with little roughness as compared with a silicon carbide semiconductor substrate obtained by another conventional method for manufacturing a silicon carbide semiconductor substrate in which epitaxial growth is performed after performing vapor phase etching only using hydrogen.

In the present embodiment, treatment time t2 in the step (S22) is 10 seconds, but the present invention is not limited to this. The lower limit value of treatment time t2 may be set at, for example, 5 seconds or more in accordance with Examples described below. Moreover, the upper limit value of treatment time t2 in the step (S22) may be set at any time equal to or less than treatment time t1 as long as the step (S21) of performing the vapor phase etching onto main surface 1A of silicon carbide substrate 1 only using hydrogen is included and treatment time t1 for the entire step (S20) is about 300 seconds. Preferably, the upper limit value of treatment time t2 is 20 seconds. Also in this way, main surface 2A of silicon carbide semiconductor substrate 10 as obtained can be a flat surface with little roughness. On the other hand, in order to reduce manufacturing cost of silicon carbide semiconductor substrate 10, it is preferable to realize silicon carbide semiconductor substrate 10 having flat main surface 2A with little roughness while reducing an amount of usage of propane by setting treatment time t2 in the step (S22) to a necessary, sufficient time as described above.

Moreover, in the present embodiment, $H_2$ is used as the etching gas for the vapor phase etching on main surface 1A of silicon carbide substrate 1 in the step (S20), but the present invention is not limited to this. For example, the vapor phase etching may be performed using hydrogen chloride (HCl) or chlorine ($Cl_2$). Also in this way, it is possible to securely remove the foreign matters of carbide or silicide adhered to or deposited on main surface 1A and securely remove the defects formed on main surface 1A of silicon carbide substrate 1.

Moreover, in the present embodiment, propane is used as the gas containing carbon atoms in the step (S22), but the present invention is not limited to this. For example, butane ($C_4H_{10}$) or methane ($CH_4$) may be used as the gas containing carbon atoms. Also in this way, the carbon atoms can be introduced into main surface 1A of silicon carbide substrate 1 in the step (S22).

Moreover, in the present embodiment, from the step (S21) to the step (S30), the flow rate of hydrogen is set to be the same as the flow rate thereof when used as a carrier gas in the step (S30); however, the present invention is not limited to this. Moreover, from the step (S22) to the step (S30), the flow rate of propane is set to be the same as the flow rate thereof when used as a source material gas in the step (S30); however, the present invention is not limited to this. Moreover, from the step (S21) to the step (S30), the temperature in the reaction chamber is set to be the same as the growth temperature in the step (S30); however, the present invention is not limited to this. Each of the conditions can be appropriately changed. However, as shown in FIG. 4, the step (S21) to the step (S30) are preferably performed continuously without varying the conditions so much such as the temperature condition and the flow rates of gases. In this way, the vapor phase etching step and the epitaxial growth step can be performed under stable conditions.

Here, the following describes characteristic configurations of the present invention although some of them have been already described in the embodiments above.

A method for manufacturing a silicon carbide semiconductor substrate according to the present invention includes steps of preparing a seed substrate (silicon carbide substrate 1) (step (S10)); performing vapor phase etching onto a solace (main surface 1A) of the seed substrate (silicon carbide substrate 1) (step (S20)); and epitaxially growing silicon carbide on the surface (main surface 1A) (step (S30)). From a point of time in the step of performing the vapor phase etching (step (S20)), a carbon-atom containing gas is supplied to the seed substrate (silicon carbide substrate 1).

Accordingly, by the step of performing the vapor phase etching (step (S20)), it is possible to securely remove foreign matters or the like adhered to or deposited on main surface 1A of silicon carbide substrate 1 and it is possible to supply main surface 1A of silicon carbide substrate 1 with the carbon-atom containing gas from a point of time in the vapor phase etching step. On this occasion, due to the vapor phase etching, the carbon atoms constituting main surface 1A react with the hydrogen atoms at a rate higher than that of the silicon atoms therewith and are removed as hydrocarbon. Accordingly, carbon atoms are insufficient in main surface 1A, with the result that a composition ratio between carbon atoms and silicon atoms is deviated from a value optimal for a seed substrate. Specifically, silicon carbide semiconductor substrate 10 obtained by epitaxial growth on main surface 1A in such a state may have a rough main surface 2A with less flatness. To address this, by performing sufficient vapor phase etching and then performing vapor phase etching with carbon atoms being supplied to main surface 1A, the vapor phase etching can be performed the atmosphere including the carbon atoms. In this case, because main surface 1A is subjected to the vapor phase etching under the atmosphere including the carbon atoms, partial pressure of the carbon atoms is increased in the vicinity of main surface 1A, thereby suppressing the vapor phase etching from providing an effect of removing the carbon atoms constituting the silicon carbide of main surface 1A. As a result, by epitaxially growing silicon carbide on main surface 1A, a silicon carbide semiconductor substrate 10 having a flat main surface with little surface roughness can be obtained.

Prior to the step of performing the epitaxial growth (step (S30)), the carbon atoms in the carbon-atom containing gas may be introduced into the surface (main surface 1A) of the seed substrate (silicon carbide substrate 1).

As described above, during the step of performing the vapor phase etching (step (S20)) in which carbon atoms are considered to be insufficient, carbon atoms are supplied to main surface 1A in the step (S22), thereby not only suppressing the vapor phase etching from providing an elect of removing the carbon atoms constituting the silicon carbide of main surface 1A but also introducing into main surface 1A the carbon atoms involved in the vapor phase etching.

The carbon-atom containing gas may be one of source material gases used in the step of epitaxially growing (step (S30)).

In this way, the step of performing the vapor phase etching (step (S20)) and the step of epitaxially growing silicon carbide (step (S30)) can be readily performed continuously. By performing them continuously, it is possible to more effectively suppress the roughness of main surface 2A of silicon carbide semiconductor substrate 10 obtained by the epitaxial growth.

The flow rate of the carbon-atom containing gas in the step of performing the vapor phase etching (step (S20)) may be equal to the flow rate of the carbon-atom containing gas in the step of epitaxially growing (step (S30)).

In this way, the step of performing the vapor phase etching (step (S20)) and the step of epitaxially growing silicon carbide (step (S30)) can be more readily performed continuously.

In the step of performing the vapor phase etching (step (S20)), the carbon-atom containing gas may be supplied to the seed substrate (silicon carbide substrate 1) for not less than 10 seconds as shown in the step (S22), and then the step of epitaxially growing (step (S30)) may be performed continuously.

In this way, main surface 2A of silicon carbide semiconductor substrate 10 can be a flat surface with little roughness as indicated in Examples described as follows.

EXAMPLES

The following describes Examples of the present invention.

Example 1

A silicon carbide semiconductor substrate according to an Example 1 was produced by the following method.

First, a silicon carbide substrate was prepared which had an outer diameter of 4 inches and had a thickness of 350 μm.

Next, the silicon carbide substrate was placed on a substrate holder of a CVD apparatus, and vacuum baking was performed for about 10 minutes to attain a temperature of 1100° C. in the reaction chamber. Then, hydrogen was introduced into the reaction chamber at a flow rate of 50 sccm, and the temperature in the reaction chamber was increased to 1580° C. With passage of 9 minutes and 50 seconds after reaching 1580° C., propane was started to be supplied into the reaction chamber. The flow rate of propane was set at 30 sccm. With passage of 10 seconds after starting to supply propane, dopant gas including silane and $NH_3$ was started to be supplied, thereby starting epitaxial growth of silicon carbide on the main surface of the silicon carbide substrate.

In this way, a silicon carbide epitaxial layer was formed which had an impurity concentration of $1.0 \times 10^{18}$ cm$^{-3}$ and had a thickness of 0.5 μm. It should be noted that the flow rate of $NH_3$ was set at 0.05 sccm. The epitaxial growth of silicon carbide was performed with the pressure in reaction chamber being set at not less than $8 \times 10^3$ Pa and not more than $12 \times 10^3$ Pa.

Example 2

A silicon carbide semiconductor substrate according to an Example 2 was produced under the same conditions as Example 1 except that: a period of time from the reaching of the temperature of the reaction chamber to 1580° C. to the supply of propane to the reaction chamber was set at 9 minutes and 45 seconds; and the dopant gas including silane and $NH_3$ was started to be supplied 15 seconds after the start of supply of propane.

Comparative Example 1

A silicon carbide semiconductor substrate according to a Comparative Example 1 was produced by the following method. First, a silicon carbide substrate was prepared Which had an outer diameter of 4 inches and had a thickness 350 μm.

Next, the silicon carbide substrate was placed on a substrate holder of a CVD apparatus, and vacuum baking was performed for about 10 minutes to attain a temperature of 1100° C., in the reaction chamber. Then, hydrogen was introduced into the reaction chamber at a flow rate of 50 sccm, and the temperature in the reaction chamber was increased to 1580° C. With passage of 6 minutes and 50 seconds after reaching 1580° C., propane was started to be supplied into the reaction chamber. The flow rate of propane was set at 30 sccm. With passage of 190 seconds after starting to supply propane, dopant gas including silane and $NH_3$ was started to be supplied, thereby starting epitaxial growth of silicon carbide on the main surface of the silicon carbide substrate.

A silicon carbide epitaxial layer was formed which had an impurity concentration of $1.0 \times 10^{18}$ cm$^{-3}$ and had a thickness of 0.5 μm. The flow rate of $NH_3$ was set at 0.05 sccm. The epitaxial growth of silicon carbide was performed with the pressure in reaction chamber being set at not less than $8 \times 10^3$ Pa and not more than $12 \times 10^3$ Pa.

Comparative Example 2

The silicon carbide semiconductor substrate according to Comparative Example 2 was produced under the same conditions as those in Example 1 except that propane and silane were supplied into the reaction chamber at the same timing. That is, in Comparative Example 2, the epitaxial growth of silicon carbide was started after performing vapor phase etching using only hydrogen for 10 minutes.

(Evaluation)

An AFM (NanoScopeIII) was used to measure the root mean square roughness (RMS value) of each of the main surfaces of the silicon carbide semiconductor substrates according to Examples 1, 2 and Comparative Examples 1, 2.

(Result)

The RMS value of the main surface of the silicon carbide semiconductor substrate according to each of Examples 1, 2 was not more than 0.8 nm. On the other hand, the RMS value of the main surface of the silicon carbide semiconductor substrate according to Comparative Example 1 was 1.8 nm. The RMS value of the main surface of the silicon carbide semiconductor substrate according to Comparative Example 2 was 2.6 nm.

That is, the main surface of the silicon carbide semiconductor substrate according to each of Examples 1, 2 had little roughness and had flatness. On the other hand, the main surface of the silicon carbide semiconductor substrate according to each of Comparative Examples 1, 2 had a high RMS value and was rough.

Heretofore, the embodiments and examples of the present invention have been described but the embodiments and examples can be modified in various manners. Moreover, the scope of the present invention is not limited to the embodiments and examples described above. The scope of the present invention is defined by the terms of the claims, and is intended to include any modifications within the scope and meaning equivalent to the terms of the claims.

REFERENCE SIGNS LIST

1: silicon carbide substrate; 1A, 2A: main surface; 2: epitaxial layer; 10: silicon carbide semiconductor substrate; 11: substrate holder; 12: induction heating coil; 13: quartz tube; 14: heat insulator; 15: heating element; 16: pipe; 100: CVD apparatus.

The invention claimed is:

1. A method for manufacturing a silicon carbide semiconductor substrate comprising steps of:
preparing a seed substrate;
performing vapor phase etching onto a surface of said seed substrate;
epitaxially growing silicon carbide on said surface; and
prior to the step of epitaxially growing, increasing a temperature of said seed substrate to a film formation temperature employed in the step of epitaxially growing,
the step of increasing the temperature being performed such that the temperature of said seed substrate is increased to a temperature for vacuum baking, said seed substrate is then maintained at said temperature for vacuum baking, the temperature is then started to be increased again to said film formation temperature, and an etching gas used in the step of performing the vapor phase etching is supplied to said seed substrate when the temperature is started to be increased again,
said etching gas being hydrogen gas,
at a point of time when the temperature of said seed substrate is increased to said film formation temperature, a flow rate of said etching gas becoming equal to a flow rate when used as carrier gas in the step of epitaxially growing, by increasing the flow rate of said etching gas after starting to supply said etching gas to said seed substrate,
the step of performing the vapor phase etching including a step of etching the surface of said seed substrate at the film formation temperature employed in the step of epitaxially growing,
a carbon-atom containing gas being supplied to said seed substrate from a point of time in the step of etching the surface of said seed substrate at said film formation temperature.

2. The method for manufacturing the silicon carbide semiconductor substrate according to claim 1, wherein prior to the step of epitaxially growing, carbon atoms in said carbon-atom containing gas are introduced into said surface of said seed substrate.

3. The method for manufacturing the silicon carbide semiconductor substrate according to claim 1, wherein said carbon-atom containing gas is one of source material gases used in the step of epitaxially growing.

4. The method for manufacturing the silicon carbide semiconductor substrate according to claim 3, wherein a flow rate of said carbon-atom containing gas in the step of performing the vapor phase etching is equal to a flow rate of said carbon-atom containing gas in the step of epitaxially growing.

5. The method for manufacturing the silicon carbide semiconductor substrate according to claim 1, wherein the step of epitaxially growing is performed continuously after supplying said carbon-atom containing gas to said seed substrate for not less than 10 seconds in the step of performing the vapor phase etching.

\* \* \* \* \*